United States Patent [19]

Atherton et al.

[11] Patent Number: 4,683,439

[45] Date of Patent: Jul. 28, 1987

[54] DIGITALLY DRIVEN SWITCHING POWER AMPLIFIER SYSTEM

[75] Inventors: Jay W. Atherton, Seattle; Raymond A. Castor, Redmond; Leonard F. Christie, Edmonds; Robert C. Engerman, Seattle, all of Wash.

[73] Assignee: Honeywell Inc., Minneapolis, Minn.

[21] Appl. No.: 817,384

[22] Filed: Jan. 9, 1986

[51] Int. Cl.[4] .............................................. H03F 3/38
[52] U.S. Cl. .................................. 330/10; 330/207 A
[58] Field of Search ...................... 330/10, 207 A, 251; 332/9 R; 375/22; 323/283; 363/41

[56] References Cited

U.S. PATENT DOCUMENTS 4,166,247 8/1979 Miyazawa ........................ 363/41 X
4,390,849 6/1983 Miskin .............................. 330/10 X

FOREIGN PATENT DOCUMENTS 149151 11/1981 Japan ...................................... 375/22

Primary Examiner—James B. Mullins
Attorney, Agent, or Firm—Roger W. Jensen

[57] ABSTRACT

A digital power amplifier system includes means providing a signal having predetermined characteristics is digitally synthesized and applied as input signals to a digital symmetrical pulse width modulator. The digital pulse width modulated signals are amplified in a digital or switching power amplifier. The resulting signals are then passed through a tuning or filter circuit to produce an analog signal having the desired frequency and wave shape characteristics which is then applied to a suitable load device. In the thus provided amplification system all of the amplification is accomplished through digital circuitry with no analog influence until the amplified circuits are applied to the tuning or filter elements.

11 Claims, 3 Drawing Figures

DIGITALLY DRIVEN SWITCHING POWER AMPLIFIER SYSTEM

BACKGROUND OF THE INVENTION

The present invention relates to a digitally driven power amplifier system.

In the art relating to acoustic signals, it is frequently important to provide a power output signal which faithfully relates to and amplifies the characteristics of a predetermined input signal. This is a particularly keen requirement of systems involving underwater sound. Heretofore, signals having a particular characteristic such as frequency and/or wave shape have been generated and then amplified by means of analog amplification systems. Analog amplification systems for power amplification are frequently subject to discrepancies due to such problems as amplitude drift, linearity, or temperature effects. Overcoming such effects in analog circuits are complex, costly, and sometimes difficult to implement.

The present invention is an improvement over that of the prior application of Jay W. Atherton for Digital Driver For Fixed Power Amplifier, filed 1-3-86, Ser. No. 815,953.

SUMMARY OF THE INVENTION

It is, accordingly, an object of the present invention to provide an improved power amplifier system which obviates the foregoing difficulties.

It is another object of the present invention to provide an improved power amplifier system as set forth which obviates analog amplification circuitry.

It is a further object of the present invention to provide an improved power amplifier system as set forth which features symmetrical digital amplification circuitry.

In accomplishing these and other objects, there has been provided, in accordance with the present invention, a digital power amplifier system in which a signal having predetermined multiple frequency and amplitude characteristics is digitally synthesized and applied as input signals in a digital binary format to a digital symmetrical pulse width modulator, as opposed to single edge modulation methods which generate higher harmonic levels. The digital pulse width modulated signals are amplified in a digital or switching power amplifier. The resulting signals are then passed through a tuning or filter circuit to produce an analog signal having the desired frequency and wave shape characteristics which is then applied to a suitable load device. In the thus provided amplification system all of the signal processing and amplification is accomplished through digital or power switching circuitry with no analog influence until the amplified signals are applied to the tuning or filter elements.

BRIEF DESCRIPTION OF THE DRAWINGS

A better understanding of the present invention may be had from the following detailed description when read in the light of the accompanying drawings in which.

DETAILED DESCRIPTION

Figure 1:
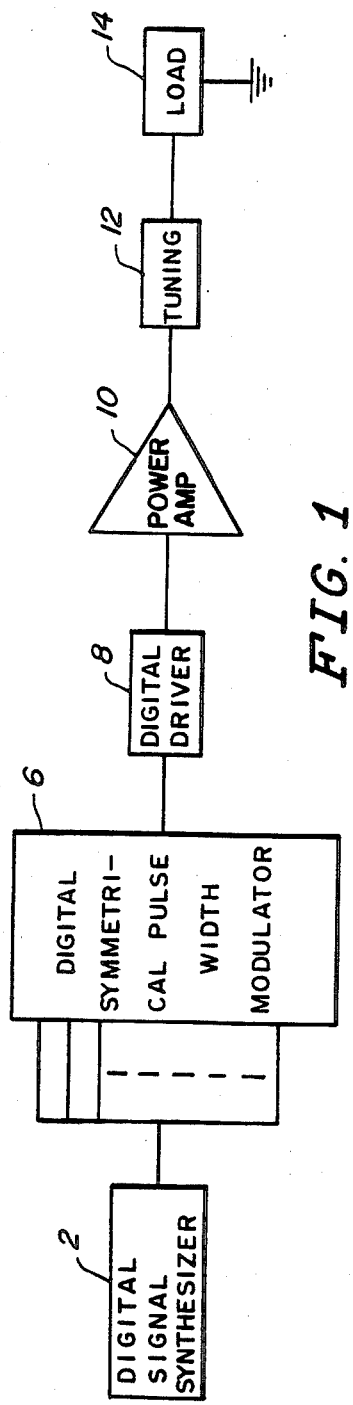
FIG. 1 is a schematic block diagram of a power amplifier embodying the present invention.

Referring now to the drawings in more detail, there is shown in FIG. 1 a power amplifier in which a particularly characterized digital signal is derived from a digital signal synthesizer 2. The synthesizer 2 may be in the form of a microprocessor such as that designated M68000. The microprocessor would be controlled to produce a multidigit output signal representative of a component of a predetermined waveform, which waveform may be either simple or complex depending on the need of the instrumentality being served. The digital signals from the synthesizer 2 are applied to a digital symmetrical pulse width modulator 6. The pulse width modulator responds to the digital input signals to provide a pulse width modulated signal which varies in accordance with the applied input signals. The pulse width modulated output signal from the modulator 6 is applied through a digital driver or buffer arrangement 8 to the input of the digital power amplifier 10. In a preferred embodiment, the power amplifier 10 is in the nature of switching amplifier means. The output of the power amplifier 10 is an amplified pulse width modulated digital signal. This amplified signal is then applied to the input of a tuning circuit or filter 12. The tuning circuit 12 may be in the form of any of the well known circuit means for converting a pulse width modulated signal into a corresponding analog signal of a corresponding frequency and wave shape. The output of the tuning circuit 12 is applied to a suitable load device 14. The load device 14 in an exemplary embodiment of the present invention might be a suitable underwater sonic transducer.

Thus far it may be seen that the power amplification system is entirely digital up to the point of the tuning circuit or filter 12. As such it is free from the limitations usually associated with analog power amplifying systems.

Figure 2:
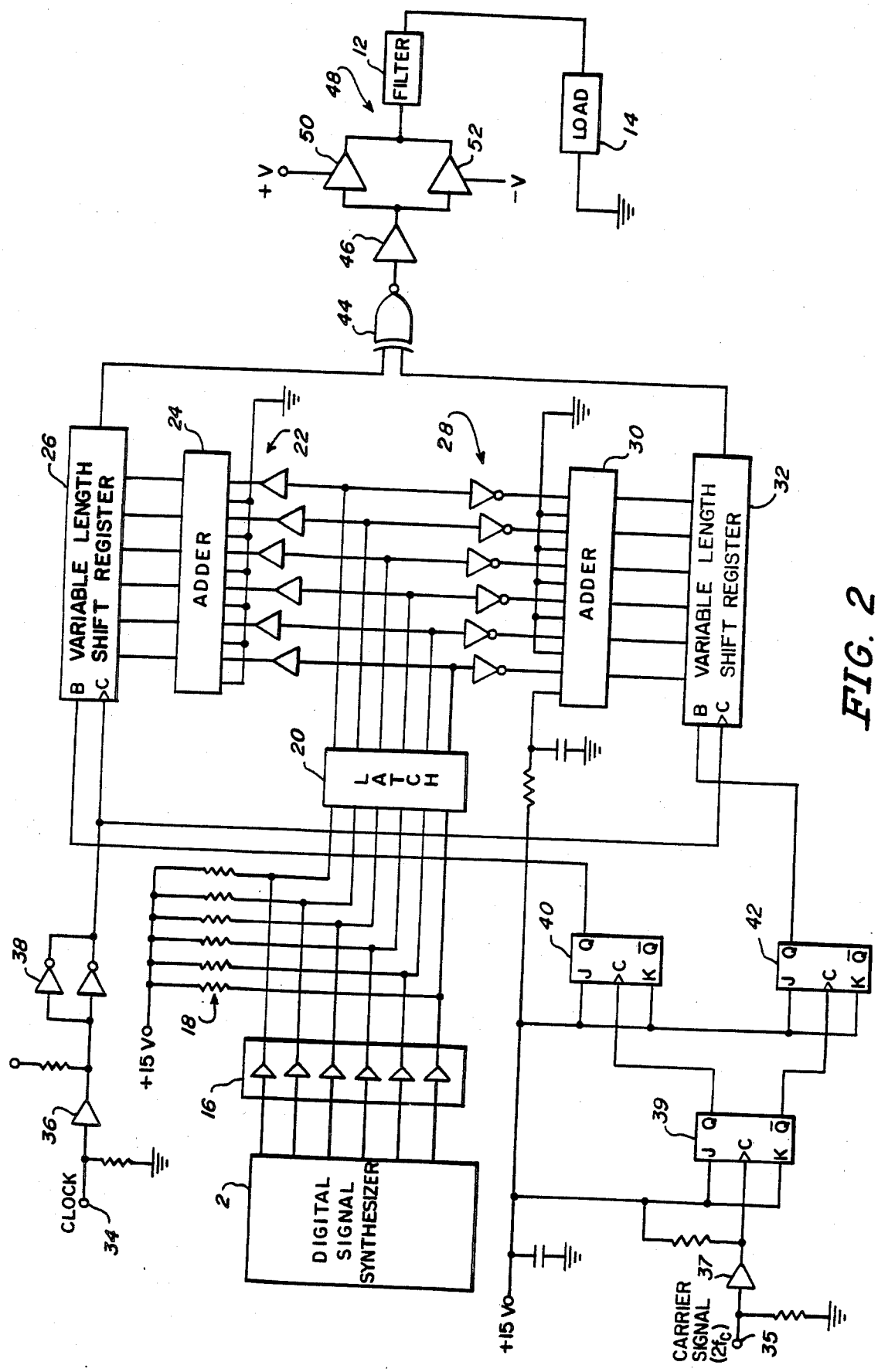
FIG. 2 is a logic block diagram showing a power amplifier in greater detail and also embodying the present invention.

In FIG. 2, there is shown an exemplary embodiment of the structure of a suitable digital symmetrical pulse width modulator such as that represented by the modulator 6 in FIG. 1. Again, input digital signals are obtained from a digital signal synthesizer 2. In the exemplary embodiment of FIG. 2, the digital synthesizer is shown as outputting a parallel offset binary 6-bit signal. It will be appreciated that the 6-bit representation is merely exemplary and that a greater number of bits will produce an output signal with a greater dynamic range and still fall within the scope of the present invention. The output signals from the digital synthesizer 2 are applied through a corresponding set of buffer amplifiers 16 and a suitable pull up network, represented by the resistor network 18, to a latch circuit arrangement 20. In the exemplary embodiment, the latch assembly 20 might be fulfilled by an integrated circuit unit identified as a 14508 chip. The output signals from the latch are applied respectively to a first set of non-inverting buffers 22 to the corresponding input terminals of a full adder circuit 24. The correlative input terminals of the adder 24 are connected to ground or logic ZERO. Again, in an exemplary embodiment, the adder 24 was formed by the use of two 4-bit adders such as integrated circuit chips 14008. The output of the adder 24 is applied as input control signals to a variable delay shift register 26. The shift register 26 in the exemplary embodiment may be a 14557 integrated circuit.

The output signals from the latch 20 are also applied respectively through a set of inverting buffers 28. The output signals of the buffers 28 are applied as input signals to an adder 30. The adder 30 is of the same type as the adder 24. In the adder 30, however, the correlative input terminals on all but the least significant bit terminal are connected to ground or logic ZERO, while the least significant bit correlative input terminal is connected to a voltage source to apply a logic ONE input to each addition operation. The output signals from the adder 30 are applied as control input signals to a variable delay shift register 32. The shift register 32 also may comprise a 14557 integrated circuit.

The shift registers 26 and 32 are clocked by a high frequency clock signal from a source 34 applied through suitable buffering amplifiers 36 and 38 to the clock input terminal "C" of each of the two shift registers 26 and 32. In a preferred embodiment, this clock signal had a frequency of 4.504 MHz.

Figure 3:
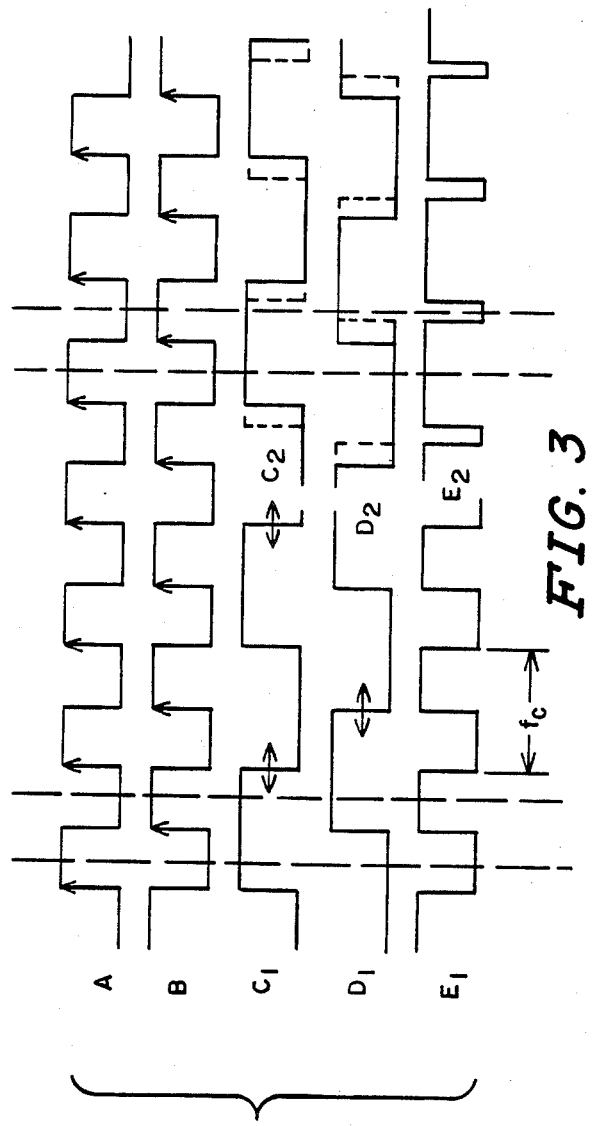
FIG. 3 is a chart showing wave forms helpful in understanding the present invention.

The input signals to the shift registers 26 and 32 are derived from a carrier signal source 35 which, in an exemplary embodiment, had a frequency of 100 KHz; said carrier frequency is twice the output carrier frequency ($f_c$) as shown in waveform $E_1$ of FIG. 3. The carrier signal 35 is connected through a suitable buffer 37 to the clock input of a J/K flip-flop 39. Both the J and the K input terminals of the flip-flop 39 are connected to a positive voltage supply. The Q output terminal of the flip-flop 39 is applied as an input signal to the clock terminal of a second J/K flip-flop 40 while the $\overline{Q}$ output terminal of the flip-flop 39 is connected to the clock input terminal of a third J/K flip-flop 42. Both the J and the K input terminals of both the flip-flops 40 and 42 are also connected to the positive voltage supply. The Q output terminal of the flip-flop 40 is connected to supply an input signal to the shift register 26 while the Q output of the flip-flop 42 is connected to supply an input signal of the shift register 32. With that arrangement, the input signals to the two shift registers 26 and 32 will be at a frequency one-forth of the carrier signal source 35 and will be 90° out of phase with respect to each other.

The control signals applied to the shift registers 26 and 32 by the adders respectively 24 and 30 control the delay imparted to the propagation of the input signals through the respective shift registers, correspondingly shifting the relative phase of the output signals from the two shift registers. Accordingly, two registers constitute variably controllable phase shifters. It was noted that the digital signals applied from the output of the latch 20 were inverted by the buffers 28 and applied through the adder 30 to control the delay in the shift register 32. A logic ONE was added to the least significant bit position of the adder 30 to compensate for the inversion of these signals relative to those signals applied to the shift register 26. In this respect, it may be noted that the buffers 22 and the adder 24 associated with the shift register 26 serve the primary purpose of compensating the signals applied to the shift register 26 for the propagation delay incurred in the buffers 28 and the adder 30 associated with the shift register 32. Thus, with the control signals applied from the adder 24 to the shift register 26 being positive, the controlled delay will produce a shift in a first direction of the signals transmitted through the shift register 26. On the other hand, the control signals supplied through the inverting buffers 28 and the adder 30 are in a negative direction. Accordingly, the effective delay in the transmission of the signals through the shift register 32 will be of the same magnitude and in a direction opposite to that of the delay imposed on the signals output from the register 26.

The thus shifted signals propagated through the shift registers 26 and 32 are applied, respectively, to the two input terminals of an EXCLUSIVE NOR gate 44. With the balanced and oppositely directed control of the two shift registers 26 and 32, the resulting output signal from the combining influence of the EXCLUSIVE NOR gate 44 will be a symmetrically pulse width modulated digital signal. The circuit will function equally well with an EXCLUSIVE OR gate substituted for gate 44.

That output signal from the EXCLUSIVE NOR gate 44, which is one-half the frequency of the carrier signal source 35, is applied through a driver 46 to power amplifier means 48. In a preferred embodiment but not restricted thereto, the power amplifier 48 is comprised of a pair of digitally responsive switching amplifiers 50 and 52. The output signal of the power amplifier 48 is an amplified and level shifted version of the symmetrically pulsed width modulated signal output from the EXCLUSIVE NOR gate 44.

To this point in the herein described system, all of the signals and the manipulation thereof have been in digital form. At this point, the power amplified signal output from the amplifier 48 may be converted to a corresponding analog signal by means of the filter 12. Both the techniques for the switching amplifiers 50 and 52 and the filter or tuning circuit 12 are well known in the art and need not be further described. The output of the filter 12 is then applied to control the operation of the appropriate load device 14 as noted in FIG. 1.

In operation, a digital signal is output from the digital signal synthesizer 2 which is the digital representative of an elemental segment of a desired signal having a predetermined frequency and wave shape. That digital signal is applied through the buffers 16 and the pull-up network 18 to the input of the latch assembly 20. That digital signal is held constant at the output of the latch assembly 20 until the signal is changed by the digital signal from the synthesizer 2 representative of the next elemental segment of the aforementioned desired wave signal. As hereinbefore mentioned, those digital signals are applied to the control input elements of the shift registers 26 and 30 respectively.

The carrier signal applied to the input terminal 35, as noted may be of the order of 100 KHz. The frequency of that signal is divided by two by operation of the flip-flop 39. A representation of the output at the Q terminal of the flip-flop 39 is shown on curve A of FIG. 3. Similarly, a representation of the output at the $\overline{Q}$ output of the flip-flop 39 is shown at curve B of FIG. 3. As noted before, the Q output of the flip-flop 39 is applied to the clock input of the flip-flop 40 where the frequency of that clock signal is again divided by two by operation of the flip-flop 40 as illustrated in curve $C_1$ of FIG. 3. Similarly, the $\overline{Q}$ output of the flip-flop 39 is applied to the clock input of the flip-flop 42 where the frequency of that signal is also divided by two by operation of the flip-flop 42 as illustrated in curve $D_1$ of FIG. 3. It will be noted that the curve of the Q output of the flip-flop 40 is 90° out of phase with the curve of the Q output of the flip-flop 42. The signal represented by the curve $C_1$ is applied as the input signal to the shift register 26. The shift register 26 is characterized in that there is a time delay in the propagation of the input signal, curve $C_1$, through the shift register to the output terminal thereof. That time delay may be controlled to be variable under control of the signals applied thereto from the adder 24. These signals from the adder 24, of course, represent the digital equivalent of the segmental portion of the predetermined control signal effected in the digital signal synthesizer 2. The magnitude and direction of the variation in the delay time is a function of a value of the digital signal applied from the adder 24 to the control inputs of the shift register 26. As an example, there is illustrated in curve $C_2$ of FIG. 3 a change in the negative direction of the propagation delay to the shift register 26.

Similarly, the Q output of the flip-flop 42 is applied as the input signal to the shift register 32. As hereinbefore noted, the shift register 32 is substantially identical to the shift register 26. Accordingly, there is an established delay between the signals input to the shift register and the corresponding signals appearing at the output thereof, due to the propagation time through the shift register 32. As was before noted, the delay in propagation through the shift register 32 is variable under control of the control signals applied thereto from the adder 30. The signals applied to the shift register 32 from the adder 30 are identical to those applied to the shift register 26 from the adder 24 with the exception that they are inverted. Accordingly, the incremental change in the delay in the propagation of the signal through the shift register 32 is identical to that in the shift register 26 but with the incremental delay change being in the opposite direction from that in the shift register 26. This is illustrated in Curve $D_2$ of FIG. 3.

The output signals from the shift register 26 and the shift register 32 are applied, respectively, to the two input terminals of the EXCLUSIVE NOR gate 44. When the control signals applied to the shift registers 26 and 32 from the adders 24 and 30, respectively, are at a value corresponding to a zero value for the ultimate resulting signal there is no resulting shift in the delay of the signals represented by the curves $C_1$ and $D_1$. When those signals are combined in the EXCLUSIVE NOR gate 44, the resulting double frequency signal appearing at the output thereof will be a symmetrical wave as represented by the curve $E_1$ of FIG. 3. On the other hand, when the value of the control signals applied to the shift registers 26 and 32 from the adders 24 and 30, respectively are such as to represent a positive value of the ultimately resulting signal, the delays through the two shift registers 26 and 32 are as represented by the curves $C_2$ and $D_2$ respectively in FIG. 3. When those two signals are combined in the EXCLUSIVE NOR gate 44, the result is a double frequency pulse width modulated signal as represented in curve $E_2$ of FIG. 3. The curve $E_2$ may, for example, represent a maximum positive value for a resultant curve. If the delays in the shift registers 26 and 32 had been controlled to be in the opposite directions, then the relative distribution of the positive and negative elements of the curve $E_2$ would have been reversed. This would, in turn, have represented a maximum negative value of the resultant curve.

It will be apparent, of course, that the illustrated relative values of the curves $E_1$ and $E_2$ are but representatives of the instantaneous value of an elemental segment of the input control signal. In accordance with the predetermined characteristic of the output signal from the digital signal synthesizer 2 the latch 20 inputs may be updated with the new bit values at a data word rate approaching half a MHz, or higher if required.

Thus, the output of the NOR gate 44 would be a series of symmetrically pulse width modulated digital signals.

That series of symmetrically pulse width modulated signals is buffered and level shifted by the buffer 46 and power amplified by the typical switching amplifiers 50 and 52 representing the power amplifier 48. The amplified pulse width modulated digital signals are then converted by the filter 12 to an analog signal having the amplitude and frequency characteristics determined by the characteristics of the signal produced by the digital signal synthesizer 2. The analog signal from the filter 12 has a power level commensurate with properly driving the load unit 14.

Thus there has been provided, in accordance with the present invention, an improved substantially all digital signal synthesizer and power amplifier with is characterized in first, a higher overall efficiency of operation, second, an avoidance of the thermal linearity, and drift characteristics associated with comparable analog power amplifiers and third, an avoidance of the sometimes difficult implementation of comparable analog circuits.

Those skilled in the art will recognize that various elements of the circuits shown herein may be varied by using well known substitutes or equivalents.

The embodiments of the invention in which an exclusive property or privilege is claimed are defined as follows:

1. A signal control circuit including a digital power amplifier, said power amplifier comprising:
   a source of digital signals representative of successive values of a predetermined signal train;
   a digital symmetrical pulse width modulating means for producing a succession of symmetrically pulse width modulated output signals;
   connecting means coupling said source of digital signals to said modulating means to control said modulating means in accordance with the digital signals from said source;
   said digital symmetrical pulse width modulating means including:
   latch means connected to said source of digital signals for holding at the output thereof each of said successive values of digital signals from said source;
   a first and a second controllabe delay shift register having an input connection, an output connection, and control input connections,
   first coupling means connected between said output of said latch means and said control input connections of said first shift register to apply said successive values directly to said control input connections,
   second coupling means connected between said output of said latch means and said control input connections of said second shift register to apply said successive values inversely to said control input connections of said second shift register,
   digital input signal means connected to apply digital input signals to said input connections of said first and second shift register,
   combining means connected to said output connection means of said first and second shift registers to provide a resultant symmetrically pulse width modulated digital output signal from said combining means; and
   switching amplifier means coupled to said modulating means to amplify said pulse width modulated output signals.

2. A signal control circuit as set forth in claim 1 wherein said digital input signal means includes means for developing a first train of pulses connected for application as input signals to said first shift register, and a second train of pulses identical to but 90° phase displaced with respect to said first train of pulse, said second train of pulses being connected for applications as input signals to said second shift register.

3. A signal control circuit as set forth in claim 2 wherein said first coupling means includes buffering amplifier means and an adder means connected between said output of said latch means and said control input connections of said first shift register; and said second coupling means includes signal inverting amplifier means and an adder means connected between said output of said latch means and said control input connections of said second shift register.

4. A signal control circuit as set forth in claim 3 wherein said second coupling means includes means for adding a logic ONE to each of said successive values inverted by said inverting amplifier means and applied to said adder means associated therewith.

5. A signal control circuit as set forth in claim 1 wherein said combining means includes an EXCLUSIVE NOR gate having a first input connection to said output connection of said first shift register, and a second input connection to said output connection of said second shift register.

6. A signal control circuit including a digital power amplifier, said power amplifier comprising:

a source of digital signals representative of successive values of a predetermined signal train;

a digital symmetrical pulse width modulating means for producing a succession of symmetrically pulse width modulated output signals;

connecting means coupling said source of digital signals to said modulating means to control said modulating means in accordance with the digital signals from said source;

said digital symmetrical pulse width modulating means including:

latch means connected to said source of digital signals for holding at the output thereof each of said successive values of said digital signals from said source;

a first controllable phase shift means having an input connection, an output connection and control input connections;

first coupling means connected between said output of said latch means and said control input connections of said first phase means to apply said successive values directly to said control input connections to control the phase shifting operation of said phase shift means in a first direction in accordance with said successive values;

a second controllable phase shift means having an input connection, an output connection and control input connections;

second coupling means connected between said output of said latch means and said control input connections of said second phase phase shift means to apply said successive values inversely to said control input connections of said second phase shaft means to control the phase shifting operation of said second phase shift means in an opposite direction with respect to that of said first phase shift means and in accordance with said successive values;

digital input signal means connected to apply digital input signals to said input connections of said first and second phase shift means;

combining means connected to said output connections of said first and second phase shift means to provide a resultant symmetrical pulse width modulated digital output signal from said combining means; and switching amplifier means coupled to said modulating means to amplify said pulse width modulated output signals.

7. A signal control circuit as set forth in claim 6 wherein said digital input signal means includes means for developing a first train of pulses connected for application as input signals to said first phase shift means, and a second train of pulses identical to but 90° phase displaced with respect to said first train of pulses, said second train of pulses being connected for application as input signals to said second phase shift means.

8. A signal control circuit as set forth in claim 7 wherein said first coupling means includes buffering amplifier means and an adder means connected between said output of said latch means and said control input connections of said first phase shift means; and said second coupling means includes signal inverting amplifier means and an adder means connected between said output of said latch means and said control input connections of said second phase shift means.

9. A signal control circuit as set forth in claim 8 wherein said second coupling means includes means for adding a logic ONE to each of said successive values inverted by said inverting amplifier means and applied to said adder means associated therewith.

10. A signal control circuit as set forth in claim 6 wherein said combining means includes an EXCLUSIVE NOR gate having a first input connection to said output connection of said first phase shift means, and a second input connection to said output connection of said second phase shift means.

11. A signal control circuit as set forth in claim 10 and including switching amplifier means connected to the output of said combining means to provide a power-amplified symmetrical pulse width a modulated digital output signal therefrom.

* * * * *

UNITED STATES PATENT AND TRADEMARK OFFICE
CERTIFICATE OF CORRECTION

PATENT NO. : 4,683,439

DATED : July 28, 1987

INVENTOR(S) : Atherton et al

It is certified that error appears in the above-identified patent and that said Letters Patent is hereby corrected as shown below:

Column 7, line 55, after "phase" insert --shift--.

Column 8, line 8, delete "shaft" and insert --shift--.

Signed and Sealed this

Twenty-ninth Day of December, 1987

Attest:

DONALD J. QUIGG

Attesting Officer      Commissioner of Patents and Trademarks